United States Patent
Chen

(10) Patent No.: US 8,315,054 B2
(45) Date of Patent: Nov. 20, 2012

(54) RACK SERVER CENTER

(75) Inventor: Chih-Hua Chen, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 134 days.

(21) Appl. No.: 13/041,430

(22) Filed: Mar. 6, 2011

(65) Prior Publication Data

US 2012/0162886 A1    Jun. 28, 2012

(30) Foreign Application Priority Data

Dec. 24, 2010   (TW) .............................. 99145931 A

(51) Int. Cl.
*H05K 7/20* (2006.01)

(52) U.S. Cl. ................ 361/696; 361/679.47; 361/679.5; 361/691; 454/184; 62/187; 62/259.2; 62/408

(58) Field of Classification Search ............ 361/679.46–679.54, 688–692, 694–697, 700–702
See application file for complete search history.

(56) References Cited

U.S. PATENT DOCUMENTS

| | | | | |
|---|---|---|---|---|
| 7,500,911 B2 * | 3/2009 | Johnson et al. | ............... | 454/184 |
| 7,508,663 B2 * | 3/2009 | Coglitore | ...................... | 361/695 |
| 7,903,407 B2 * | 3/2011 | Matsushima et al. | ......... | 361/695 |
| 7,957,142 B2 * | 6/2011 | Noteboom et al. | ........... | 361/696 |
| 7,961,463 B2 * | 6/2011 | Belady et al. | ................. | 361/695 |
| 8,050,034 B2 * | 11/2011 | Ootani | .......................... | 361/696 |
| 2001/0029163 A1 * | 10/2001 | Spinazzola et al. | ........... | 454/184 |
| 2010/0024445 A1 * | 2/2010 | Cichanowicz | .................... | 62/86 |

* cited by examiner

*Primary Examiner* — Courtney Smith
(74) *Attorney, Agent, or Firm* — Altis Law Group, Inc.

(57) ABSTRACT

A rack server center includes servers, an air conditioning system for bringing cooling air to the rack server, and an air exhaust system located outside the rack server. The air exhaust system includes an exhaust fan, branch pipes, controlling valves, and a main pipe. Each branch pipe is connected with a corresponding server via a corresponding controlling valve. The branch pipes are connected with an inlet of the exhaust fan. The main pipe is connected with an outlet of the exhaust fan. The exhaust fan is configured for exhausting heated air generated by the servers out of the rack server via the branch pipes. Each server is configured for controlling the amount of the heated air entering a corresponding branch pipe by controlling the controlling valve connected with the corresponding branch pipe.

7 Claims, 2 Drawing Sheets

RACK SERVER CENTER

BACKGROUND

1. Technical Field

The present disclosure relates to server centers, and particularly to a rack server center with satisfactory heat dissipation.

2. Description of Related Art

Rack server centers generally include a plurality of rack servers. Each of the rack servers includes a rack and a plurality of servers stacked on the rack. When the servers working, a large amount of heat is generated by the servers, therefore effective heat dissipation is necessary.

Referring to FIG. 2, a typical rack server center 100 defines a rack server center 103. A rack server 101 is positioned in the rack server center 103. A fan 102 is disposed in the rack server 101. An air conditioning system 105 inhales air from the environment of the rack server center 103 and generates cooling air 106. The fan 102 inhales the cooling air 106 from a side of the rack server 101 and expels heated air 107 out of the rack server 101 from an opposite side of the rack server 101, whereby heat generated by the rack server 101 is dissipated out of the rack server 101. Then, the heated air 107 is drawn out of the rack server center 103 by an exhaust fan 104.

However, the fan 102 inhales the cooling air 106 at a side of the rack server 101 and expels the heated air 107 to the opposite side of the rack server 101, therefore, the opposite side of the rack server 101 is still kept in a high temperature state, at the same time, the heated air 107 backflow appears in the rack server center 103, which leads to a lower heat dissipating efficiency.

What is needed, therefore, is a new rack server center which can overcome the above problems.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
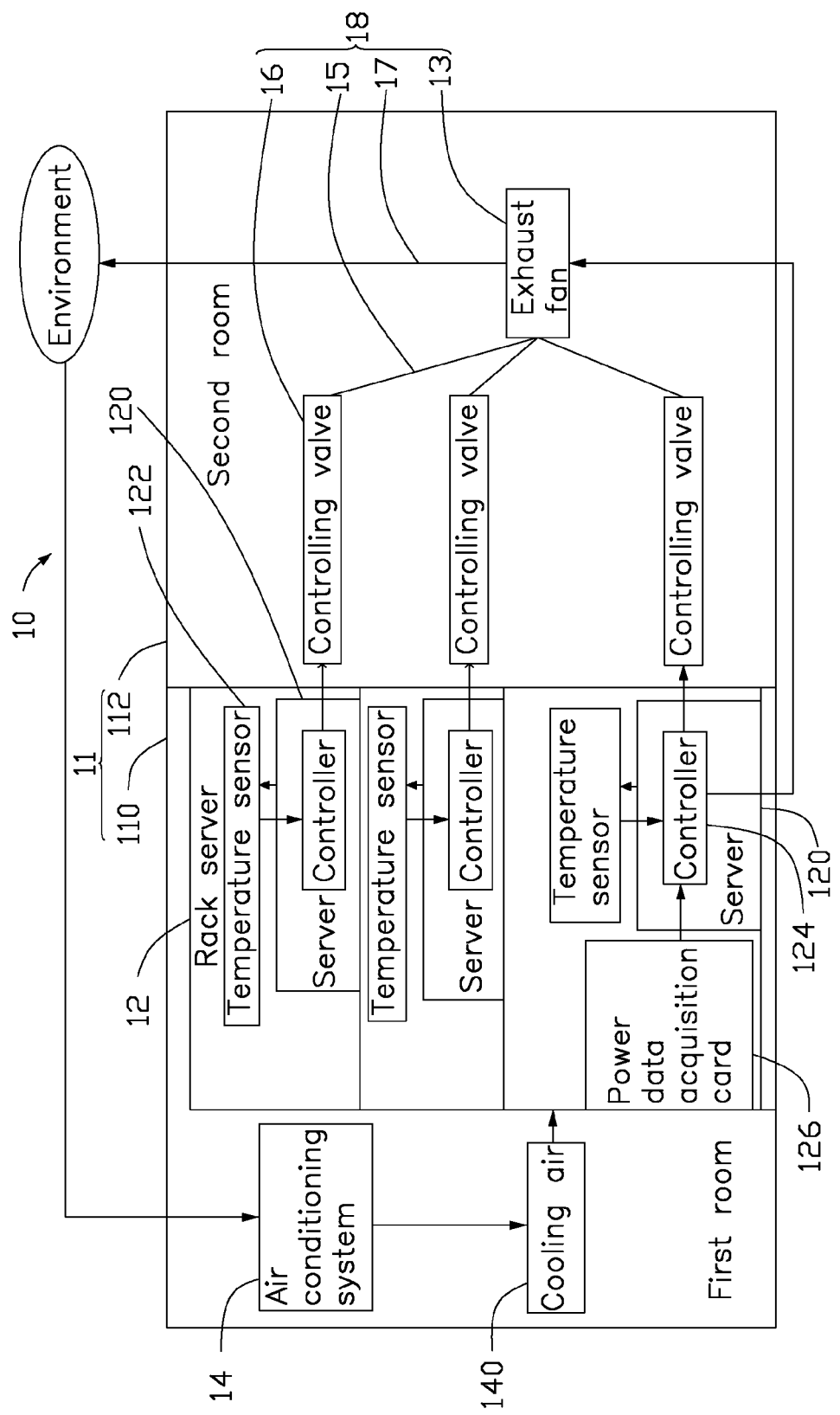
FIG. 1 is a schematic view of a rack server center in accordance with an embodiment of the disclosure.
Figure 2:
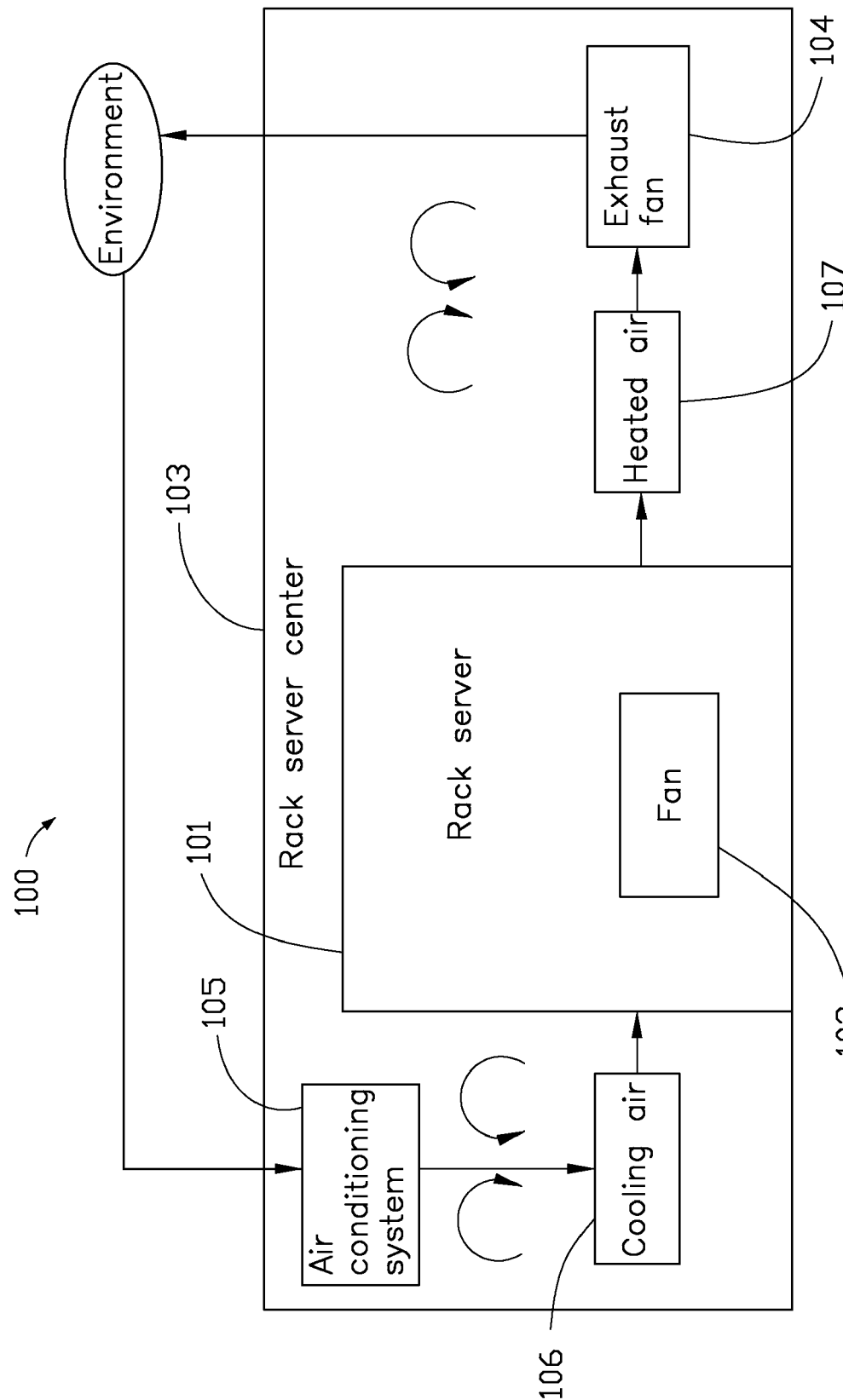
FIG. 2 is a schematic view of a rack server center of a related art.

Referring to FIG. 1, a rack server center 10 in accordance with an embodiment of the disclosure comprises a rack server 12, an air conditioning system 14, and an air exhaust system 18. The rack server center 10 defines a server room 11. The server room 11 is divided into a first room 110 and a second room 112.

The air conditioning system 14 and the rack server 12 are disposed in the first room 110. The air conditioning system 14 is used for inhaling air from the environment of the server room 11 and generating cooling air 140 for the rack server 12. The rack server 12 comprises a plurality of servers 120 and a plurality of temperature sensors 122. Each temperature sensor 122 is electrically connected to a corresponding server 120 and used for detecting the temperature of the corresponding server 120. Each server 120 comprises a controller 124.

The air exhaust system 18 is disposed in the second room 112. The air exhaust system 18 comprises an exhaust fan 13, a plurality of branch pipes 15, a plurality of controlling valves 16, and a main pipe 17. Each branch pipe 15 is connected to a corresponding server 120 of the rack server 12 through a corresponding controlling valve 16 and used for conducting heat generated by the corresponding server 120. The branch pipes 15 are connected with an inlet of the exhaust fan 13. The main pipe 17 is connected with an outlet of the exhaust fan 13.

Heated air generated by the servers 120 is drawn by the exhaust fan 13 out of the rack server 12 via the branch pipes 15 and is expelled to the environment of the server room 11 via the main pipe 17. At the same time, the air conditioning system 14 brings the cooling air 140 into the first room 110. The cooling air 140 enters into the rack server 12 to cool down the servers 120. Thus, another dissipating cycle starts.

Each controller 124 is electrically connected to a corresponding controlling valve 16. Each controller 124 is used for controlling the open size of a corresponding controlling valve 16 to control the amount of the air entering the corresponding branch pipe 15 based on the temperature obtained from a corresponding temperature sensor 122. The corresponding temperature sensor 122 reads a temperature of the server 120 and outputs a temperature data to the controller 124. The controller 124 sends a control signal to the corresponding controlling valve 16 to control the open size of the corresponding controlling valve 16.

When the temperature of the server 120 is low, the open size of the corresponding controlling valve 16 is controlled by the controller 124 to become small; when the temperature of the server 120 is high, the open size of the controlling valve 16 is controller by the controller 124 to become large.

The rack server 12 further comprises a power data acquisition card 126. The power data acquisition card 126 is electrically connected to the controller 124 of one of the servers 120. The controller 124 of the one of the servers 120 is electrically connected to the exhaust fan 13. The power data acquisition card 126 is used for obtaining the power consumption of the rack server 12 and sending the power consumption of the rack server 12 to the controller 124. The controller 124 is used for controlling the operating voltage of the exhaust fan 13 according to the power consumption of the rack server 12, thereby controlling the rotation speed of the exhaust fan 13. When the power consumption of the rack server 12 is high, the rotation speed of the exhaust fan 13 becomes faster; when the power consumption of the rack server 12 is low, the rotation speed of the exhaust fan 13 becomes slower, whereby the power consumption of the exhaust fan 13 can be controlled according to the power consumption of the rack server 12. In one embodiment, the exhaust fan 13 is a dual standby fan. In one embodiment, the server room 11 is defined by a movable container.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A rack server center comprising:

a rack server comprising a plurality of servers;

an air conditioning system for bringing cooling air to the rack server; and an air exhaust system located outside the rack server, the air exhaust system comprising an exhaust fan, a plurality of branch pipes, a plurality of controlling valves, and a main pipe, each of the branch pipes being connected with a corresponding server via a corresponding controlling valve, the branch pipes being connected with an inlet of the exhaust fan, the main pipe being connected with an outlet of the exhaust fan, wherein the exhaust fan is configured for exhausting heated air generated by the servers out of the rack server via the branch pipes, each server is configured for controlling the amount of the heated air entering a corresponding branch pipe by controlling the controlling valve connected with the corresponding branch pipe.

2. The rack server center of claim 1, defining a server room, wherein the air conditioning system, the rack server and the air exhaust system are positioned in the server room; the exhaust fan is configured for exhausting the heated air out of the server room through the main pipe.

3. The rack server center of claim 2, wherein the server room comprises a first room and a second room; the air conditioning system and the rack server are positioned in the first room, the air exhaust system is positioned in the second room.

4. The rack server center of claim 2, wherein the server room is defined by a movable container.

5. The rack server center of claim 1, wherein each of the servers comprises a controller; the rack server comprises a plurality of temperature sensors; each of the temperature sensors is electrically connected with a corresponding server and configured for detecting a temperature of the corresponding server and sending a temperature data to the controller of the corresponding server; the controller is configured for controlling a corresponding controlling valve based on the temperature data.

6. The rack server center of claim 5, wherein the rack server comprises a power data acquisition card, the power data acquisition card is electrically connected with the controller of one of the servers; the controller of the server is electrically connected to the exhaust fan; the power data acquisition card is configured for obtaining the power consumption of the rack server and sending the power consumption of the rack server to the controller; the controller is configured for controlling the rotation speed of the exhaust fan based on the power consumption of the rack server.

7. The rack server center of claim 6, wherein the exhaust fan is a dual standby exhaust fan.

* * * * *